(12) United States Patent
Clark (10) Patent No.: US 8,962,078 B2
(45) Date of Patent: Feb. 24, 2015

(54) METHOD FOR DEPOSITING DIELECTRIC FILMS

(75) Inventor: Robert D. Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 101 days.

(21) Appl. No.: 13/531,397

(22) Filed: Jun. 22, 2012

(65) Prior Publication Data

US 2013/0344248 A1 Dec. 26, 2013

(51) Int. Cl.
*C23C 16/30* (2006.01)

(52) U.S. Cl.
USPC ............ 427/255.29; 427/255.31; 427/255.39

(58) Field of Classification Search
USPC ........................... 427/255.29, 255.31, 255.39
See application file for complete search history.

(56) References Cited

U.S. PATENT DOCUMENTS

| | | | |
|---|---|---|---|
| 3,373,051 A * | 3/1968 | Chu et al. ................. | 438/778 |
| 6,410,454 B1 * | 6/2002 | Muranaka et al. ........... | 438/758 |
| 6,495,436 B2 | 12/2002 | Ahn et al. | |
| 6,524,918 B2 | 2/2003 | Park et al. | |
| 6,579,767 B2 | 6/2003 | Park et al. | |
| 6,608,378 B2 | 8/2003 | Ahn et al. | |
| 6,717,226 B2 | 4/2004 | Hegde et al. | |
| 6,762,114 B1 | 7/2004 | Chambers | |
| 6,987,063 B2 | 1/2006 | Adetutu et al. | |
| 7,258,895 B2 | 8/2007 | Sandhu | |
| 7,553,769 B2 * | 6/2009 | Toma et al. ................. | 438/696 |
| 2003/0036268 A1 | 2/2003 | Brabant et al. | |
| 2003/0186515 A1 | 10/2003 | Dean et al. | |
| 2003/0232506 A1 | 12/2003 | Metzner et al. | |
| 2004/0018307 A1 * | 1/2004 | Park et al. ................. | 427/255.36 |
| 2004/0023462 A1 | 2/2004 | Rotondaro et al. | |
| 2005/0094352 A1 * | 5/2005 | Komatsu et al. ............. | 361/504 |
| 2006/0062917 A1 | 3/2006 | Muthukrishnan et al. | |
| 2007/0277734 A1 | 12/2007 | Lubomirsky et al. | |
| 2008/0173919 A1 * | 7/2008 | Kudelka et al. .............. | 257/306 |
| 2009/0308759 A1 * | 12/2009 | Waycuilis ................. | 205/619 |

OTHER PUBLICATIONS

Park, In-Sung, et al., "Metal Precursor Effects on Deposition and Interfacial Characteristics of HfO2 Dielectrics Grown by Atomic Layer Deposition". Journal of the Korean Physical Society, vol. 49, Dec. 2006, pp. S544-S547.*

Park H. B. et al. "Performance and reliability improvement of HfSiON gate dielectrics using chlorine plasma treatment" Applied Physics Letters 94 (2009) 042911-1-042911-03.

* cited by examiner

*Primary Examiner* — Bret Chen (57) ABSTRACT

A method is provided for depositing a dielectric film on a substrate. According to one embodiment, the method includes providing the substrate in a process chamber, exposing the substrate to a gaseous precursor to form an adsorbed layer on the substrate, exposing the adsorbed layer to an oxygen-containing gas, a nitrogen-containing gas, or an oxygen- and nitrogen-containing gas, or a combination thereof, to form the dielectric film on the substrate, generating a hydrogen halide gas in the process chamber by a decomposition reaction of a hydrogen halide precursor gas, and exposing the dielectric film to the hydrogen halide gas to remove contaminants from the dielectric film.

19 Claims, 8 Drawing Sheets

METHOD FOR DEPOSITING DIELECTRIC FILMS

FIELD OF THE INVENTION

The present invention relates to semiconductor processing, and more particularly, to forming dielectric films on a substrate.

BACKGROUND OF THE INVENTION

High dielectric constant (high-k) materials are desirable for use as capacitor dielectrics and for use as gate dielectrics in future generations of electronic devices. The first high-k materials used as capacitor dielectrics were tantalum oxide and aluminum oxide materials. Currently, hafnium aluminum oxide materials are being implemented as capacitor dielectrics in DRAM production. Similarly, hafnium-based dielectrics are expected to enter production as gate dielectrics, thereby replacing or complimenting the current silicon-containing materials.

The most common methods of depositing high-k dielectrics include physical vapor deposition (PVD), chemical vapor deposition (CVD) and atomic layer deposition (ALD). The advantages of using ALD over PVD and CVD methods include improved thickness control for thin films, improved uniformity across the wafer and improved conformality over high aspect ratio structures.

The atomic layer deposition process includes separate pulses of reactive vapor streams to a process chamber containing a substrate, where the pulses can be separated by either purging or evacuating. During each pulse, a self-limited chemisorbed layer is formed on the surface of the wafer, which layer then reacts with the component included in the next pulse. Purging or evacuation between each pulse is used to reduce or eliminate gas phase mixing of the reactive vapor streams. The typical ALD process results in well-controlled sub-monolayer or near monolayer growth per cycle.

One representative case of ALD is deposition of aluminum oxide ($Al_2O_3$) from trimethylaluminum and water. In this ALD process, a pulse of trimethylaluminum will react with hydroxyl groups on the surface of a heated substrate to form a chemisorbed layer of methyl-aluminum moieties that are self-limited to less than a monolayer. The reaction chamber is then purged or evacuated to remove unreacted trimethylaluminum as well as any vapor phase reaction by-products. A pulse of water vapor is then introduced which reacts with the surface aluminum-methyl bonds and regenerates a hydroxylated surface. By repeating the above deposition cycle it is possible to realize layer by layer film growth of about 1 angstrom ($10^{-10}$ m) per cycle. By selecting different reactive precursors and gases, it is possible to deposit many different types of films using ALD processes.

Current high-k dielectric materials under evaluation suffer from various problems. Some of the problems encountered include film crystallization during anneals, growth of interfacial layers during deposition and further processing, large densities of interface traps, reduced channel mobility, reaction with poly-silicon gates, Fermi level pinning with metal gates, and leakage current through the films in the semiconductor device. Other problems encountered with current high-k dielectric materials include dielectric constants that are too low compared to desired values for advanced semiconductor devices.

SUMMARY OF THE INVENTION

A method is provided for depositing dielectric films on a substrate. According to some embodiments, the dielectric films can include high-dielectric-constant (high-k) films that contain a metal element, for example $HfO_2$ and $ZrO_2$ films. According to some embodiments, the dielectric films can contain silicon, germanium, a metal, or a combination thereof. Examples include $SiO_2$, SiN, SiON, $GeO_2$, GeN, GeON, $HfSiO_x$, and $ZrSiO_x$.

According to one embodiment, the method includes providing the substrate in a process chamber, exposing the substrate to a gaseous precursor to form an adsorbed layer on the substrate, exposing the adsorbed layer to an oxygen-containing gas, a nitrogen-containing gas, or an oxygen- and nitrogen-containing gas, or a combination thereof, to form the dielectric film on the substrate. The method further includes generating a hydrogen halide gas in the process chamber by a decomposition reaction of a hydrogen halide precursor gas, and exposing the dielectric film to the hydrogen halide gas to remove contaminants from the dielectric film.

According to another embodiment, the method includes providing the substrate in a process chamber, exposing the substrate to a gaseous precursor to form an adsorbed layer on the substrate, exposing the adsorbed layer to a hydrogen halide gas to remove contaminants from the adsorbed layer, and exposing the adsorbed layer to an oxygen-containing gas, a nitrogen-containing gas, or an oxygen- and nitrogen-containing gas, or a combination thereof, to form the dielectric film on the substrate.

According to yet another embodiment, the method includes providing the substrate in a process chamber, exposing the substrate to a gaseous precursor containing silicon, germanium, a metal, or a combination thereof, to form an adsorbed layer on the substrate, wherein the adsorbed layer further contains carbon and/or nitrogen contaminants, and exposing the substrate to an oxygen-containing gas, a nitrogen-containing gas, or an oxygen- and nitrogen-containing gas, or a combination thereof, to form the dielectric film on the substrate. The method further includes generating a hydrogen halide gas in the process chamber by a decomposition reaction of a hydrogen halide precursor gas, and exposing the adsorbed layer, the dielectric film, or both the adsorbed layer and the dielectric film, to the hydrogen halide gas to remove the contaminants from the adsorbed layer, from the dielectric film, or from both the adsorbed layer and the dielectric film.

DETAILED DESCRIPTION OF THE DRAWINGS

In the accompanying drawings.

DETAILED DESCRIPTION OF SEVERAL EMBODIMENTS OF THE INVENTION

A method is provided for depositing dielectric films on a substrate. The dielectric films can be conformally deposited using a low thermal budget and provide low leakage current when integrated into a semiconductor device. This is achieved by depositing the dielectric films with low levels of contaminants and defects. According to some embodiments, the dielectric films can include high-dielectric-constant (high-k) films that contain a metal element, for example $HfO_2$ and $ZrO_2$ films. According to another embodiment, the dielectric films can include silicon-containing dielectric films that do not contain a metal element, for example $SiO_2$, SiN, and SiON. According to other embodiments, the dielectric films can include high-k films that contain a metal element and silicon, for example $HfSiO_x$ and $ZrSiO_x$.

Many metal-organic precursors contain contaminants and impurities that can become incorporated into the dielectric films. For example, incorporation of carbon (and/or other contaminants) can result in high levels of leakage current through the dielectric films and can also lower the dielectric constant of the high-k films. Furthermore, carbon-containing background gases in processing systems may become a source for carbon contamination in the dielectric films. Accordingly, the inventors have discovered new methods for forming dielectric films with low contamination levels that are suitable for semiconductor devices, including as gate dielectric materials.

One skilled in the relevant art will recognize that the various embodiments may be practiced without one or more of the specific details described herein, or with other replacement and/or additional methods, materials, or components. In other instances, well-known structures, materials, or operations are not shown or described in detail herein to avoid obscuring aspects of various embodiments of the invention. Similarly, for purposes of explanation, specific numbers, materials, and configurations are set forth herein in order to provide a thorough understanding of the invention. Furthermore, it is understood that the various embodiments shown in the figures are illustrative representations and are not drawn to scale.

Reference throughout this specification to "an embodiment" or "one embodiment" means that a particular feature, structure, material, or characteristic described in connection with the embodiment is included in at least one embodiment of the invention, but does not denote that it is present in every embodiment. Thus, the appearances of the phrases "in an embodiment" or "in one embodiment" in various places throughout this specification is not necessarily referring to the same embodiment of the invention.

Figure 1A:
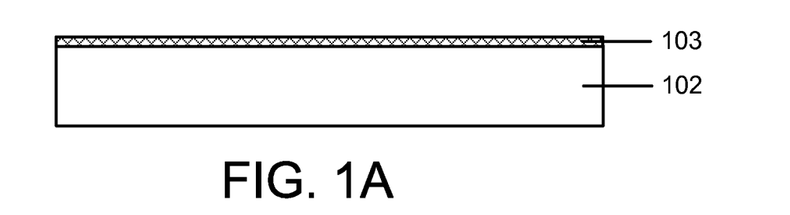
FIGS. 1A-1E schematically illustrate a method of forming a dielectric film on a substrate according to an embodiment of the invention.
Figure 2:
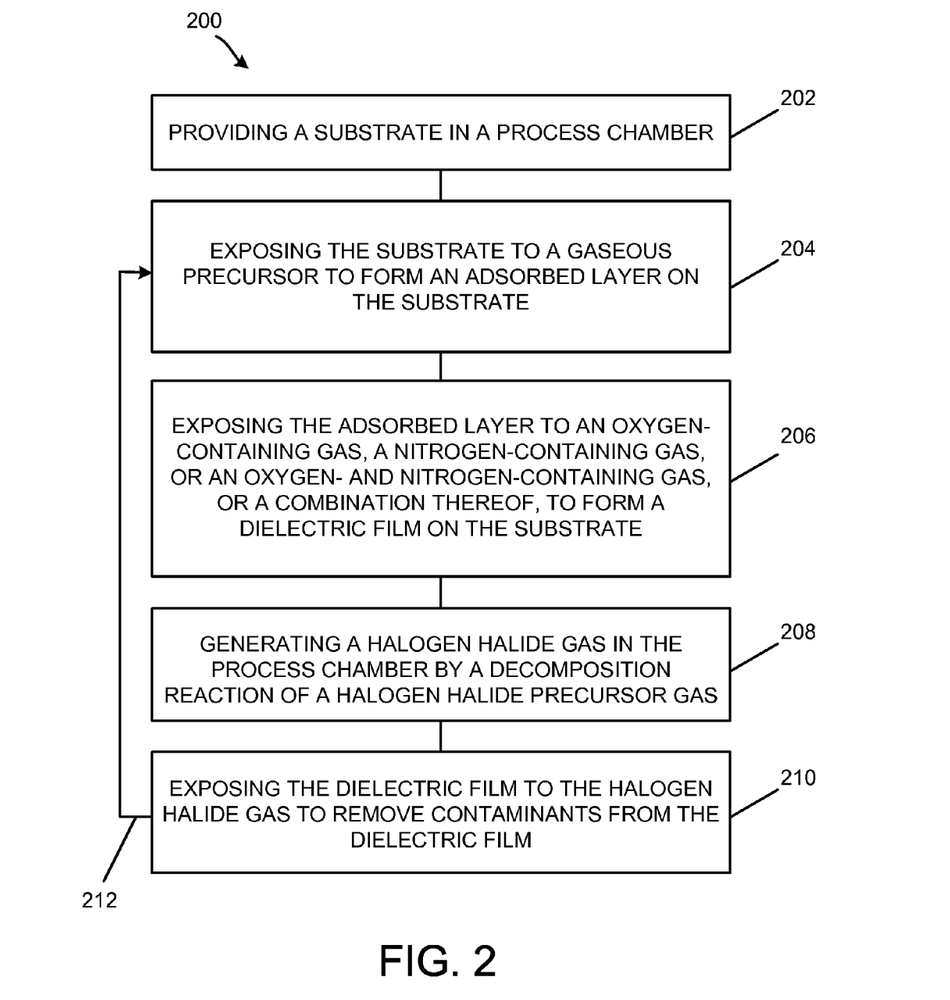
FIG. 2 is a flow diagram for forming a dielectric film on a substrate according to an embodiment of the invention.

Referring now to FIG. 1A and the flow diagram 200 in FIG. 2, in step 202, a substrate 102 is provided in a process chamber. The substrate 102 can include silicon (Si) and/or germanium (Ge) and can be of any size, for example a 200 mm substrate, a 300 mm substrate, a 450 mm substrate, or an even larger substrate. According to one embodiment, the substrate 102 can contain Si, for example crystalline Si, polycrystalline Si, or amorphous Si. In one example, the substrate 102 can be a tensile-strained Si layer. According to another embodiment, the substrate 102 may contain Ge or $Si_xGe_{1-x}$ compounds, where x is the atomic fraction of Si, 1-x is the atomic fraction of Ge, and $0<(1-x)<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 102 can be a compressive-strained Ge layer or a tensile-strained $Si_xGe_{1-x}$ (x>0.5) deposited on a relaxed $Si_{0.5}Ge_{0.5}$ buffer layer. According to another embodiment, the substrate 102 can contain a III-V, II-VI, IV-VI, or II-V semiconductor, for example GaAs, InGaAs, InSb, InGaSb, SrSe, or SrTe.

Prior to forming a dielectric film on the substrate 102, the substrate 102 may be cleaned in a liquid bath containing dilute hydrofluoric acid (HF) or, alternatively, by HF gas phase etching. The dilute HF liquid solution can be a $H_2O$:HF (e.g., a 50:1) mixture. Following the HF cleaning process, the substrate 102 may be rinsed in de-ionized (D.I.) water. As shown in FIG. 1A, the substrate 102 can have an interface layer 103 thereon. The interface layer 103 can be a dielectric film that can contain silicon oxide (e.g., $SiO_x$, where x is equal to or less than 2), silicon nitride, silicon oxynitride, or a combination thereof. In one example, the interface layer 103 can contain high mobility, low defect $SiO_2$. The interface layer 103 can have a thickness between about 5 angstrom and about 15 angstrom, between about 6 angstrom and about 10 angstrom, for example about 8 angstrom. The interface layer 103 may be formed on a clean substrate 102.

The interface layer 103 may contain a chemical oxide layer formed by oxidizing a surface of a monocrystalline silicon substrate 102 following removal of a native oxide layer. The chemical oxide layer may be formed in an aqueous bath containing deionized (DI) water and ozone ($O_3$), for example. The chemical oxide layer can be of high purity and can have a thickness between about 6 angstrom and about 15 angstrom. The chemical oxide layer passivates the underlying unoxidized portion of the monocrystalline silicon substrate 102 and forms a barrier to native oxide formation upon air exposure. Following formation of the chemical oxide layer, the substrate 102 is removed from the aqueous solution and dried, for example by a combination of isopropyl alcohol application and spin-drying. The presence of the chemical oxide layer on the substrate 102 limits buildup of atmospheric contaminants (e.g., organic contaminants) to the exposed surface of the chemical oxide layer upon transferring the substrate 102 from the aqueous solution to a vacuum processing tool for further processing. According to other embodiments, a clean substrate 102 may be transferred to the vacuum processing tool and the interface layer formed in the vacuum processing tool.

The interface layer formed by wet or dry processing may contain germanium oxide, germanium oxynitride, aluminum oxide, or aluminum oxynitride. The interface layer may include a semiconductor or epitaxial layer. For instance the interface layer may include amorphous silicon, or indium phosphide. Furthermore, the interface layer may include multiple layers. For instance, the interface layer may include amorphous silicon as well as silicon oxide formed in a wet or dry process in order to create a high mobility interface with the device channel.

Following the cleaning, in step 204, the substrate 102 is exposed to a gaseous precursor that reacts on the interface layer 103 to form an adsorbed layer 104 on the substrate 102.

Figure 1B:
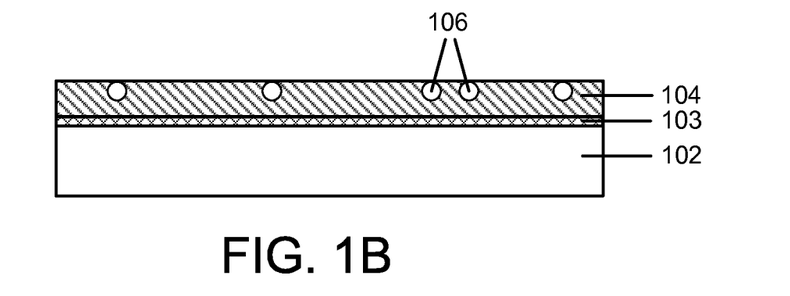

According to embodiments of the invention, the gaseous precursor and the adsorbed layer 104 can contain silicon, germanium, a metal, or a combination thereof. The gaseous precursor may be selected from silicon precursors and metal precursors that do not contain a halogen. The use of non-halogen-containing precursors can improve conformality of the adsorbed layer 104 when compared to deposition processes that utilize halogen-containing precursors. The gaseous precursor containing germanium can, for example, contain germane ($GeH_4$). The gaseous precursor containing silicon can, for example, contain a silane ($SiH_4$), disilane ($Si_2H_6$), or a combination thereof. According to one embodiment, the gaseous precursor can be selected from alkyl silanes. These compounds all have the general formula $SiR_4$, were R is any ligand including but not limited to hydrogen, alkyl, and aryl (all R groups are independent). Examples of this class of compounds include methylsilane (1MS), dimethylsilane (2MS), trimethylsilane (3MS), and tetramethylsilane (4MS). A closely related class of compounds includes alkyl polysilanes which include, but are not limited to substituted disilanes and trisilanes. Substituted disilanes have the general formula $Si_2R_4$, and substituted trisilanes have the general formula $Si_3R_8$. In all cases, R is any ligand including but not limited to hydrogen, alkyl, and aryl (all R groups are independent). Examples of this class of compounds include methyldisilane and hexamethyldisilane (HMDS).

According to another embodiment, the gaseous precursor can include amino silanes (which include, but are not limited to bis(t-butyl amino) silane and tetrakis (dimethyl amino silane), cyclodisilazanes (which include, but are not limited to 1,3-diethyl-1,2,3,4-tetramethylcyclodisilazane, 1,3-divinyl-1,2,3,4-tetramethylcyclodisilazane, and 1,1,3,3-tetrafluoro-2,4-dimethylcyclodisilazane), linear and branched silazanes (which include, but are not limited to hexamethyldisilazane and tris(trimethylsilyl)amine, azidosilanes, substituted versions of 1,2,4,5-tetraaza-3,6-disilacyclohexane (which include, but are not limited to 3,6-bis(dimethylamino)-1,4-ditertiarybutyl-2,5-dimethyl-1,2,4,5-tetraaza-3,6-disilacyclohexane and 3,6-bis(tertiarybutylamino)-1,4-ditertiarybutyl-1,2,4,5-tetraaza-3,6-disilacyclohexane), and silyl hydrazines (which include, but are not limited to 1-silylhydrazine, 1,2-disilylhydrazine, 1,1,2-trisilylhydrazine, and 1,1,2,2-tetrasilylhydrazine).

According to one embodiment, the gaseous precursor may be selected from silicon precursors that do contain a halogen. A class of compounds includes halogenated alkyl silanes. These compounds have a variety of general formulas based on the number of halogens incorporated into the molecule. The general formulas are: $SiXR_3$ for one halogen incorporation, $SiX_2R_2$ for a two halogen incorporation, and $SiX_3R$ for three halogen incorporation. In case of one and two halogen incorporations, R is any ligand including but not limited to hydrogen, alkyl, and aryl (all R groups are independent). In the three halogen case only, R cannot be hydrogen, but it can be alkyl, aryl, or other carbon-containing ligand. In all cases X is any halogen (F, Cl, Br, or I).

According to another embodiment, the gaseous precursor and the adsorbed layer 104 can contain a metal, for example hafnium, zirconium, aluminum, rare earth elements, alkaline earth elements, titanium, tantalum, or niobium, or a combination thereof. In some examples, the gaseous precursor may contain a metal-nitrogen or a metal-carbon intramolecular chemical bond. Examples of hafnium and zirconium gaseous precursors with metal-nitrogen intramolecular chemical bonds include $Hf(NMe_2)_4$, $Hf(NEtMe)_4$, $Hf(NEt_2)_4$, hafnium amidinates, $Zr(NMe_2)_4$, $Zr(NEtMe)_4$, $Zr(NEt_2)_4$, and zirconium amidinates. Examples of precursors containing a metal-carbon intramolecular bond include $Hf(O^tBu)_4$, hafnium cyclopentadienyls, $Zr(O^tBu)_4$, and zirconium cyclopentadienyl The cyclopentadienyl precursors can include $Cp_2HfMe(OMe)$, $Cp_2HfMe_2$, $CpHf(NMe_2)_3$, $Cp_2ZrMe(OMe)$, $Cp_2ZrMe_2$, and $CpZr(NMe_2)_3$.

The gas exposure in step 204 may be carried out using processing conditions (i.e., gas pressure, substrate temperature, etc.) that allow for atomic layer deposition (ALD) of a dielectric film on the substrate 102. ALD of thin films is a type of cyclic deposition that refers to sequential introduction of different precursors to deposit a thin film onto a substrate. In particular, the deposition may include sequential introduction of a pulse of a first precursor (e.g., a silicon precursor or a metal precursor), followed by a pulse of a purge gas and/or a pump evacuation, followed by a pulse of a second precursor (e.g., an oxygen-containing gas), which is followed by a pulse of a purge gas and/or a pump evacuation. Sequential introduction of separate pulses results in alternating self-limiting chemisorption of approximately one monolayer of each precursor on the surface of the substrate and forms a monolayer of deposited thin film in each cycle. The self-limiting chemisorption layer is usually less than a monolayer thick due to the large size of the first precursor compared to the size of the central element (e.g., metal element). The self-limiting adsorption saturates the substrate surface and prevents further adsorption of the precursors. The sequential introduction of precursors is repeated as necessary to form a thin film with a desired thickness. One drawback of ALD is that the growth rate for the thin film can be very low compared to CVD methods. A typical growth rate of an ALD process is 1-2 angstrom (Å)/cycle. One version of ALD is plasma-enhanced ALD (PEALD), where at least one of the precursors is plasma activated.

According to another embodiment, the exposure in 204 may be carried out using a higher substrate temperature than for an ALD process. The higher substrate temperature can enable a CVD mode, where an amount of the first precursor that is reacted on the substrate surface is not self-limiting and may be greater than one monolayer.

As schematically depicted in FIG. 1B, the adsorbed layer 104 may contain contaminants 106. The contaminants 106 may originate from the gaseous precursors and/or from background gases in the process chamber. For example, the contaminant 106 may contain carbon and/or nitrogen. If the contaminants 106 are not removed from the adsorbed layer 104, they may become incorporated into a fully manufactured semiconductor device. This may lead to poor electrical properties of the device. For example, a transistor containing a carbon-contaminated gate dielectric film can exhibit unacceptably high levels of leakage current and the carbon-contamination can also lower the dielectric constant of the gate dielectric film.

Following step 204, the process chamber may be purged and/or evacuated to removing any unreacted precursor and byproducts.

Figure 1C:
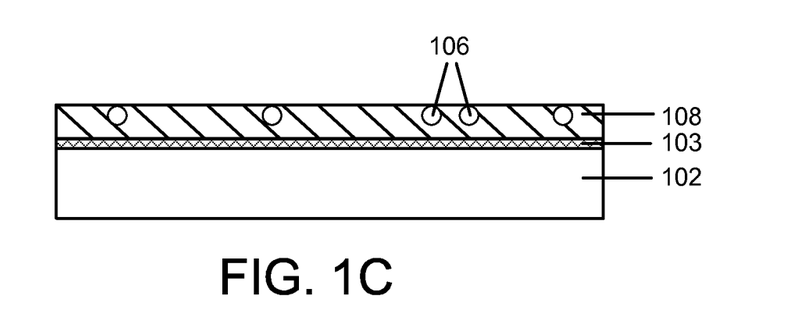

In step 206, the adsorbed layer 104 is exposed to an oxygen-containing gas, a nitrogen-containing gas, or an oxygen- and nitrogen-containing gas, or a combination thereof, to react with the adsorbed layer 104 and form a dielectric film 108 on the substrate. According to some embodiments, the dielectric film 108 may include an oxide film (e.g., $HfO_2$ or $ZrO_2$), a nitride film (film (e.g., HfN or ZrN), or an oxynitride film (e.g., HfON or ZrON). Other examples include oxides, nitrides, or oxynitrides of aluminum, rare earth elements, titanium, tantalum, or niobium. However, embodiments of the invention are not limited to those metals as other metals of the Periodic Table of the Elements are contemplated and may be used. Further, the dielectric film 108 may contain ternary, quaternary, or more complex oxides. Still further, the dielectric film 108 may have compositional gradients across a thickness of the dielectric film 108.

According to an embodiment, the dielectric film 108 can include silicon-containing dielectric films that do not contain a metal element, for example $SiO_2$, SiN, and SiON. According to other embodiments, the dielectric film 108 can include high-k films that contain a metal element and silicon, for example $HfSiO_x$ and $ZrSiO_x$. According to another embodiment, the dielectric film 108 can include germanium-containing dielectric films that do not contain a metal element, for example $GeO_2$, GeN, and GeON. According to other embodiments the dielectric films can include high-k films that contain a metal element and germanium, for example $HfGeO_x$ and $ZrGeO_x$.

In some examples, the oxygen-containing gas can include thermally excited or plasma excited $O_2$, $H_2O$, $H_2O_2$, or a combination thereof. Further, the nitrogen-containing gas can include thermally excited or plasma excited $N_2$, $NH_3$, $N_2H_4$, or $C_1$-$C_{10}$ alkylhydrazine compounds, or a combination thereof. Still further, the oxygen- and nitrogen-containing gas can include thermally excited or plasma excited NO, $NO_2$, or $N_2O$, or a combination thereof.

According to one embodiment, the exposure steps 204 and 206 may be exposure steps of an ALD process. Alternately, the exposure steps 204 and 206 may be exposure steps of a CVD process. As depicted in FIG. 1C, the resulting dielectric film 108 may contain the contaminants 106 from step 204 and/or from step 206. In some examples, the dielectric film 108 may include $HfO_2$, $ZrO_2$, $HfSiO_x$, or $ZrSiO_x$ that contains carbon contaminants 106.

Following step 206, the process chamber may be purged and/or evacuated to removing any unreacted precursor and byproducts.

In step 208, a hydrogen halide gas (e.g., HCl or HF) is generated in the process chamber by a decomposition reaction of a hydrogen halide precursor gas. In some examples, the halogenated hydrocarbon may include a halogenated alkane, a halogenated alkene, or a halogenated alkyne, or a combination thereof. Examples of a halogenated hydrocarbons include 1,1,1-trichloroethane and trans-1,2-dichloroethylene.

Figure 1D:
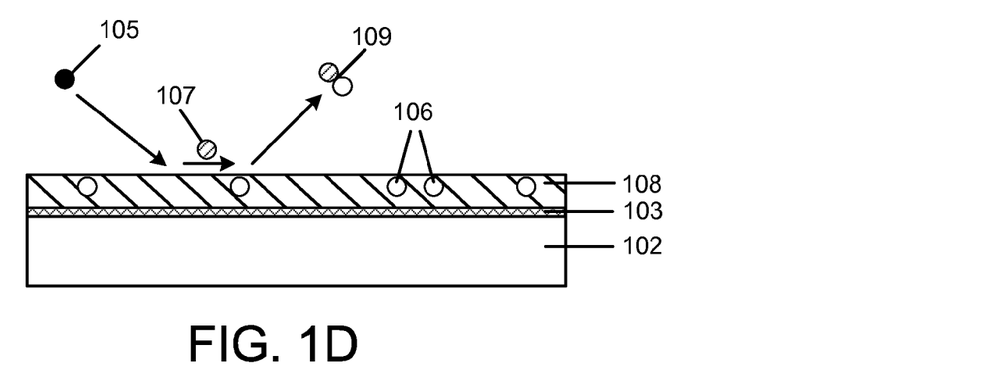

In step 210, as schematically depicted in FIG. 1D, a hydrogen halide precursor 105 that is flowed into the process chamber is exposed to the heated dielectric film 108 to generate hydrogen halide gas 107 that reacts with and removes the contaminants 106 from the dielectric film 108 and the process chamber as a volatile byproduct 109. Further, the hydrogen halide gas 107 may passivate various defects in the dielectric film. Alternatively, the hydrogen halide gas may be generated by a decomposition reaction of the hydrogen halide precursor elsewhere in the process chamber away from the substrate 102. For example, the hydrogen halide gas 107 may be generated from the hydrogen halide precursor 105 by a plasma or by a heated system component in the process chamber.

Figure 1E:
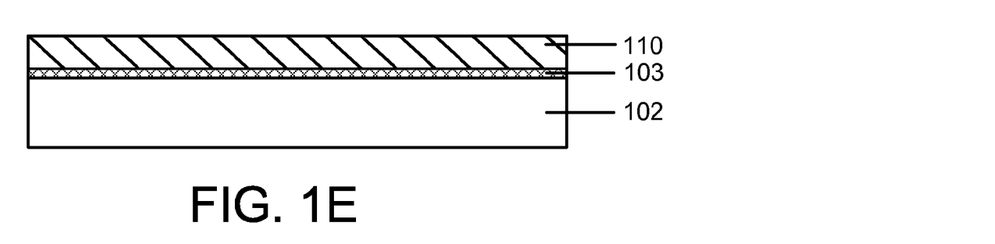

FIG. 1E schematically shows a dielectric film 110 following the exposure of the dielectric film 108 to the hydrogen halide precursor which reduces or substantially eliminates the amount of contaminants 106 in the dielectric film 108. The dielectric film 110 may subsequently further processed to form a semiconductor device.

The inventors have realized, that the generation of a hydrogen halide gas in the process chamber from a hydrogen halide precursor provides better control over the concentration of the hydrogen halide gas that is exposed to the dielectric film 108 when compared to a delivery method that includes flowing a hydrogen halide gas into the process chamber. Providing good control over low concentrations of the hydrogen halide gas is required to avoid excess residual halogen content in the resulting dielectric film 110 and in a device containing the dielectric film 110.

The processing steps 204, 206, 208, and 210 may be repeated one or more times as indicated by process arrow 212 until the dielectric film 110 has the desired thickness. In one example, the dielectric film 110 can have a thickness between about 10 angstrom and about 20 angstrom, or between about 20 angstrom and about 40 angstrom.

According to some embodiments, the exposure step 210 may have partial or full temporal overlap with one or more of the exposure steps 204 and 206 in the process flow 200. Further, the exposure step 210 may have partial or full temporal overlap with the purging and/or evacuation steps. In general, since the exposure step 210 does not interfere with the exposure steps 204 and 206, and the purging and/or evacuation steps, the exposure step 210 may be performed at any time during the process flow in flow diagram 200.

According to some embodiments, the exposure step 210 may result in a partial etching of the substrate 102, the interface layer 103, or the dielectric film 110, in addition to removing contaminants 106 from the dielectric film 110.

According to one embodiment, a non-halogen-containing precursor may be used in step 204 to form the adsorbed layer 104. Thereafter, in step 206, the adsorbed layer 104 may be exposed to an oxygen-containing gas (e.g., $H_2O$) to react with the adsorbed layer 104 and form a dielectric film 108 on the substrate. The inventors have realized that the use of a non-halogen-containing precursor can minimize or prevent the formation of undesirable reaction byproducts such as HCl or $NH_4Cl$ when using $H_2O$ or $NH_3$, respectively, in step 206. The absence of these reaction byproducts on the adsorbed layer 104 can improve conformality of the adsorbed layer 104 when compared to deposition processes that utilize halogen-containing precursors. FIGS. 3A-3E and the flow diagram 400 in FIG. 4 described another embodiment of the invention. This embodiment is similar to the embodiment described in FIGS. 1A-1E and the flow diagram 200 in FIG. 2, and therefore, for brevity, a description of various common details of these embodiments will not be repeated.

Figure 3A:
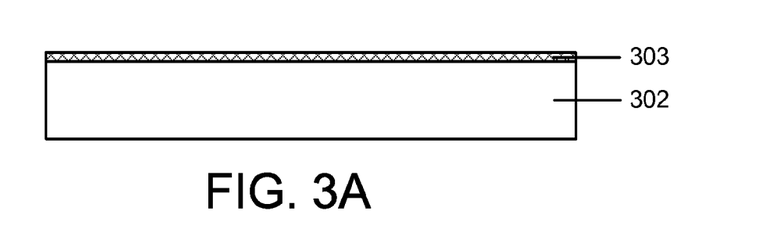
FIGS. 3A-3E schematically illustrate a method of forming a dielectric film on a substrate according to an embodiment of the invention.
Figure 4:
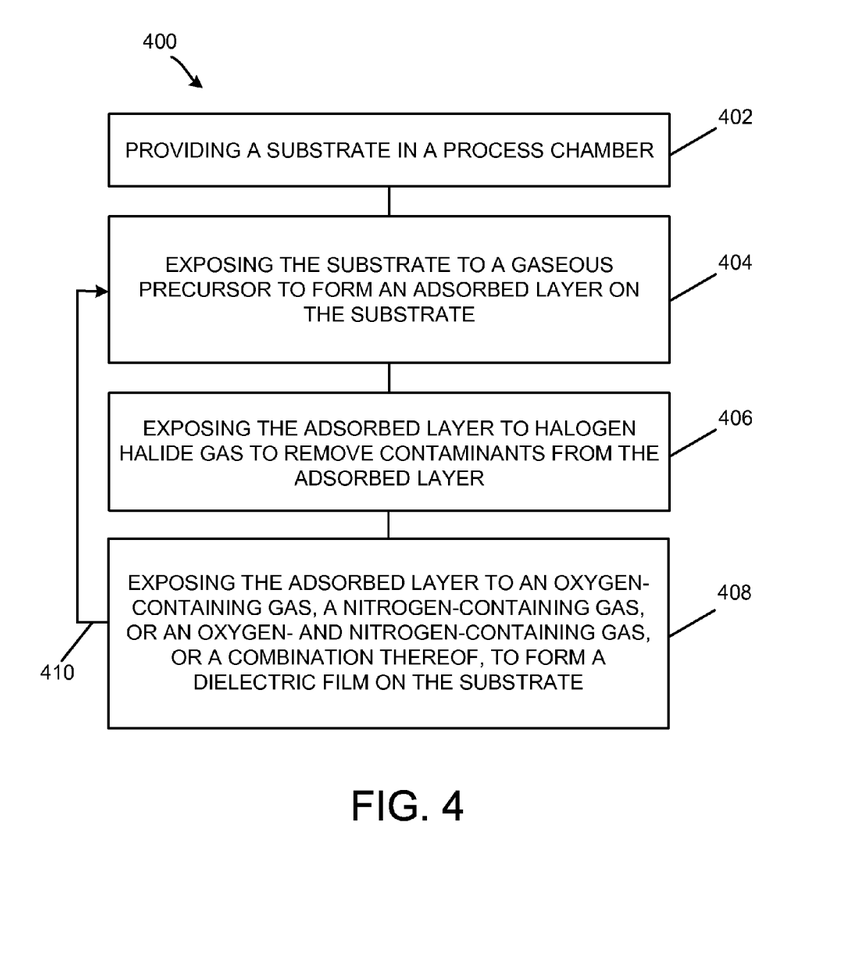
FIG. 4 is a flow diagram for forming a dielectric film on a substrate according to an embodiment of the invention.

Referring now to FIG. 3A and the flow diagram 400 in FIG. 4, in step 402, a substrate 302 containing an interface layer 303 is provided in a process chamber.

In step 404, the substrate 302 is exposed to a gaseous precursor that reacts on the interface layer 303 to form an adsorbed layer 304 on the interface layer 303 (FIG. 3B), where the adsorbed layer 304 contains contaminants 306.

Following step 404, the process chamber may be purged and/or evacuated to removing any unreacted precursor and byproducts.

In step 406, the adsorbed layer 304 is exposed to hydrogen halide gas to remove contaminants 306 from the adsorbed layer 304. According to one embodiment, as described in above in reference to FIG. 1D and FIG. 2, the hydrogen halide gas may be generated in the process chamber by a decomposition reaction of a hydrogen halide precursor gas. Alternately, the hydrogen halide gas may be flowed into the process chamber from a hydrogen halide gas supply system that is external to the process chamber.

Figure 3B:
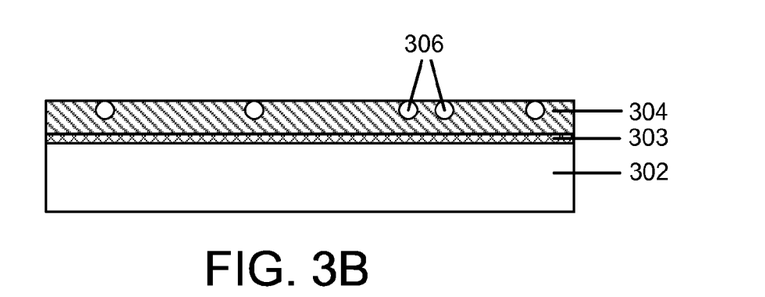
Figure 3C:
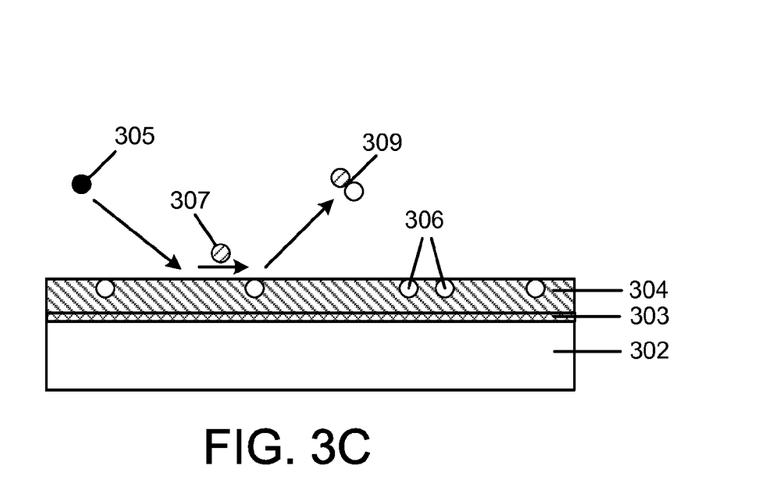
Figure 3D:
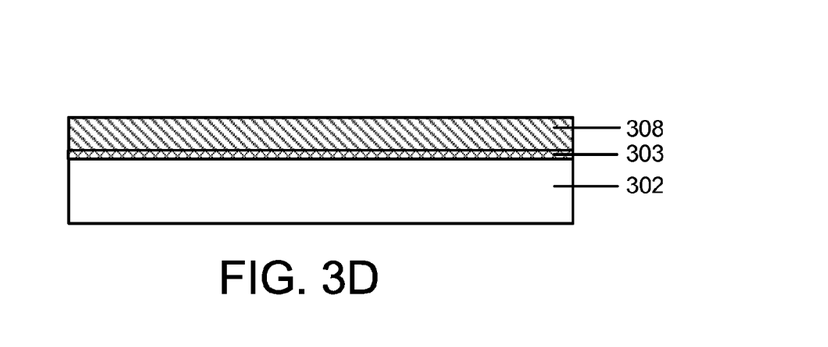

FIG. 3D schematically shows an adsorbed layer 308 following the exposure of the adsorbed layer 304 to the hydrogen halide precursor or the hydrogen halide gas which reduces or substantially eliminates the contaminants 306 in the adsorbed layer 308.

Following step 406, the process chamber may be purged and/or evacuated to removing any unreacted precursor and byproducts.

Figure 3E:
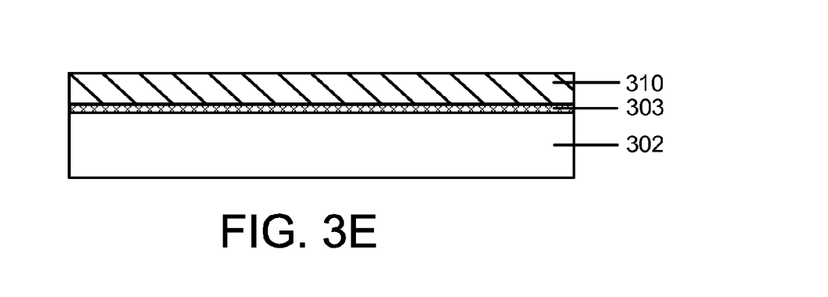

In step 408, the adsorbed layer 308 is exposed to an oxygen-containing gas, a nitrogen-containing gas, or an oxygen- and nitrogen-containing gas, or a combination thereof, to react with the adsorbed layer 308 to form a dielectric film 310 on the substrate 302 (FIG. 3E).

Following step 408, the process chamber may be purged and/or evacuated to removing any unreacted first precursor or byproducts.

The processing steps 404, 406, and 408 may be repeated one or more times as indicated by process arrow 410 until the dielectric film 310 has the desired thickness. In one example, the dielectric film 310 can have a thickness between about 10 angstrom and about 20 angstrom, or between about 20 angstrom and about 40 angstrom.

According to some embodiments, the exposure step 406 may have partial or full temporal overlap with one or more of the exposure steps 404 and 408 in the flow diagram 400. Further, the exposure step 406 may have partial or full temporal overlap with the purging and/or evacuation steps. In general, since the exposure step 406 does not interfere with the exposure steps 404 and 408, and the purging and/or evacuation steps, the exposure step 406 may be performed at any time during the process flow in flow diagram 400.

According to some embodiments, the exposure step 406 may result in a partial etching of the substrate 302, the interface layer 303, or the adsorbed layer 304, in addition to removing contaminants 306 from the adsorbed layer 304.

According to one embodiment, the interface layer 103, the dielectric film 110, or both the interface layer 103 and the dielectric film 110, may be formed using the process flow 200. In one example, the processing steps 204-206 may be used to form an interface layer 103 (e.g., a dielectric film $SiO_2$) on the substrate 102, and thereafter, the processing steps 204-210 may be carried out again to form a dielectric film 110 (e.g., a $HfO_2$ dielectric film) on the interface layer 103. In this example, both the $SiO_2$ and $HfO_2$ films are formed using the process flow 200.

According to another embodiment, the interface layer 303, the dielectric film 310, or both the interface layer 303 and the dielectric film 310, may be formed using the process flow 400. In one example, the processing steps 404-408 may be used to form an interface layer 303 (e.g., a dielectric film $SiO_2$) on the substrate 302, and thereafter, the processing steps 404-408 may be carried out again to form a dielectric film 310 (e.g., a $HfO_2$ dielectric film) on the interface layer 303. In this example, both the $SiO_2$ and $HfO_2$ films are formed using the process flow 400.

According to yet another embodiment, the interface layer 103 may be formed using the process flow 200 and the dielectric film 110 may be formed using the process flow 400. According to still another embodiment, the interface layer 103 may be formed using the process flow 400 and the dielectric film 110 may be formed using the process flow 200.

Figure 5A:
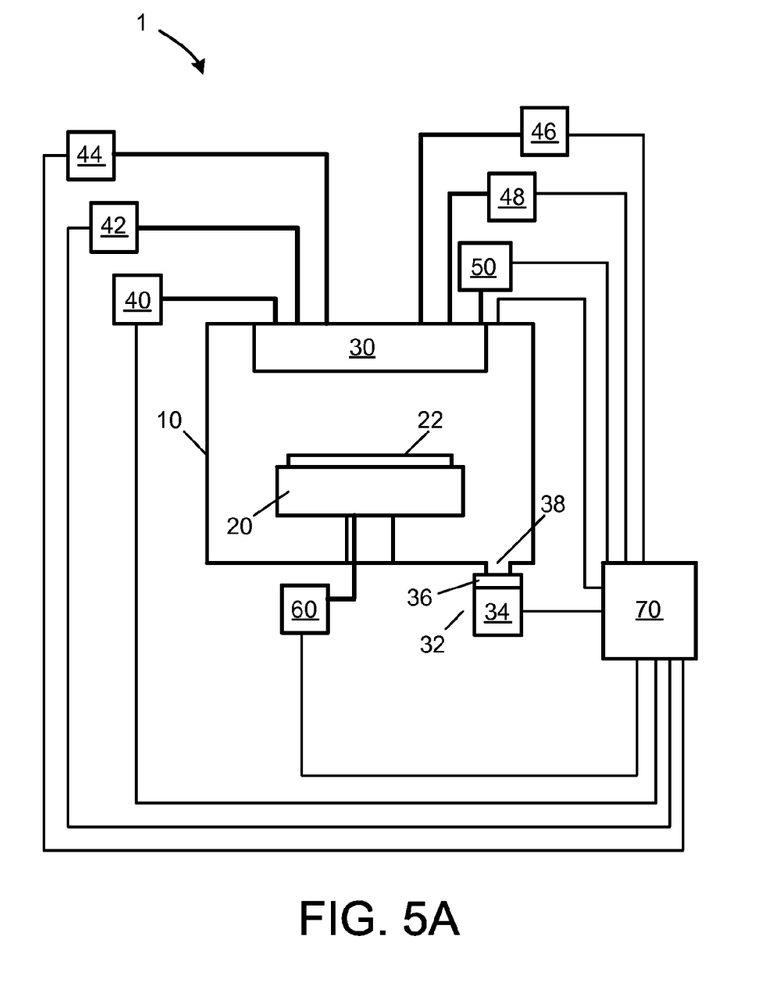
FIG. 5A illustrates a processing system for depositing a dielectric film on a substrate according to an embodiment of the invention.

FIG. 5A illustrates a processing system 1 for depositing a dielectric film on a substrate according to one embodiment of the invention. The processing system 1 may be configured for carrying out ALD or CVD processing and includes a process chamber 10 having a substrate holder 20 configured to support a substrate 25, upon which the dielectric film is formed. The process chamber 10 further contains an upper assembly 30 (e.g., a showerhead) coupled to a silicon or germanium precursor supply system 40, a metal precursor supply system 42, a purge gas supply system 44, an oxygen-containing gas supply system 46, a nitrogen-containing gas supply system 48, and a hydrogen halide precursor supply system 50. Additionally, the processing system 1 includes a substrate temperature control system 60 coupled to substrate holder 20 and configured to elevate and control the temperature of substrate 25. Furthermore, the processing system 1 includes a controller 70 that can be coupled to process chamber 10, substrate holder 20, assembly 30 configured for introducing process gases into the process chamber 10, silicon or germanium precursor supply system 40, metal precursor supply system 42, purge gas supply system 44, oxygen-containing gas supply system 46, nitrogen-containing gas supply system 48, hydrogen halide precursor gas supply system 50, and substrate temperature control system 60. Although not shown, the processing system 1 can further contain an oxygen- and nitrogen-containing gas supply system and a hydrogen halide gas supply system.

Alternatively, or in addition, controller 70 can be coupled to one or more additional controllers/computers (not shown), and controller 70 can obtain setup and/or configuration information from an additional controller/computer.

In FIG. 5A, singular processing elements (10, 20, 30, 40, 42, 44, 46, 48, 50, and 60) are shown, but this is not required for the invention. The processing system 1 can include any number of processing elements having any number of controllers associated with them in addition to independent processing elements.

The controller 70 can be used to configure any number of processing elements (10, 20, 30, 40, 42, 44, 46, 48, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 5A, the processing system 1 may be configured to process 200 mm substrates, 300 mm substrates, 450 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto. Alternately, a batch processing system capable of processing multiple substrates simultaneously may be utilized for depositing the dielectric films described in the embodiments of the invention.

According to one embodiment, the silicon or germanium precursor supply system 40 and the metal precursor supply system 42 are configured to alternately or simultaneously introduce a silicon or germanium precursor and a metal precursor to process chamber 10. The alternation of the introduction of the silicon or germanium precursor and the metal precursor can be cyclical, or it may be acyclical with variable time periods between introduction of the silicon and metal precursors.

Still referring to FIG. 5A, the purge gas supply system 44 is configured to introduce a purge gas to process chamber 10. For example, the introduction of purge gas may occur between introduction of pulses of silicon or germanium precursor, metal precursor, an oxygen-containing gas, a nitrogen-containing gas, an oxygen- and a nitrogen-containing gas, a hydrogen halide precursor gas, or hydrogen halide gas to the process chamber 10. The purge gas can comprise an inert gas, such as a noble gas (i.e., He, Ne, Ar, Kr, Xe), nitrogen ($N_2$), or hydrogen ($H_2$).

Furthermore, processing system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the process chamber 10 and any other component within the processing system 1. The substrate temperature control system 60 can, for example, be configured to elevate and control the substrate temperature from room temperature to approximately 350° C. to 550° C. Alternatively, the substrate temperature can, for example, range from approximately 150° C. to 350° C. It is to be understood, however, that the temperature of the substrate is selected based on the desired temperature for causing deposition of a particular dielectric material on the surface of a given substrate.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. The vacuum pumping system may also include a cryogenic or cooled trap for trapping residual precursor. Moreover, a device for monitoring chamber pressure (not shown) can be coupled to the process chamber 10. The pressure measuring device can be, for example, a Type 628B Baratron absolute capacitance manometer commercially available from MKS Instruments, Inc. (Andover, Mass.). The pressure control system 32 can, for example, be configured to control the process chamber pressure between about 0.1 Torr and about 100 Torr during deposition of the dielectric materials.

The silicon or germanium precursor supply system 40, the metal precursor supply system 42, the purge gas supply system 44, the oxygen-containing gas supply system 46, the nitrogen-containing gas supply system 48, and the hydrogen halide precursor gas supply system 50 can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec. Exemplary gas pulse lengths for silicon and metal precursors can be between 0.3 and 3 sec, for example 1 sec. Exemplary gas pulse lengths for a hydrogen halide precursor gas can be between 0.1 and 3 sec, for example 0.3 sec. Exemplary gas pulse lengths for an oxygen-containing gas, a nitrogen-containing gas, and an oxygen- and nitrogen-containing gas can be between 0.3 and 3 sec, for example 1 sec. Exemplary purge gas pulses can be between 1 and 20 sec, for example 3 sec.

Still referring to FIG. 5A, controller 70 can comprise a microprocessor, memory, and a digital I/O port capable of generating control voltages sufficient to communicate and activate inputs to the processing system 1 as well as monitor outputs from the processing system 1. Moreover, the controller 70 may be coupled to and may exchange information with the process chamber 10, substrate holder 20, upper assembly 30, silicon or germanium precursor supply system 40, metal precursor supply system 42, purge gas supply system 44, oxygen-containing gas supply system 46, nitrogen-containing gas supply system 48, hydrogen halide gas supply system 50, substrate temperature control system 60, substrate temperature control system 60, and pressure control system 32. For example, a program stored in the memory may be utilized to activate the inputs to the aforementioned components of the deposition system 1 according to a process recipe in order to perform a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 via a wireless connection.

Figure 5B:
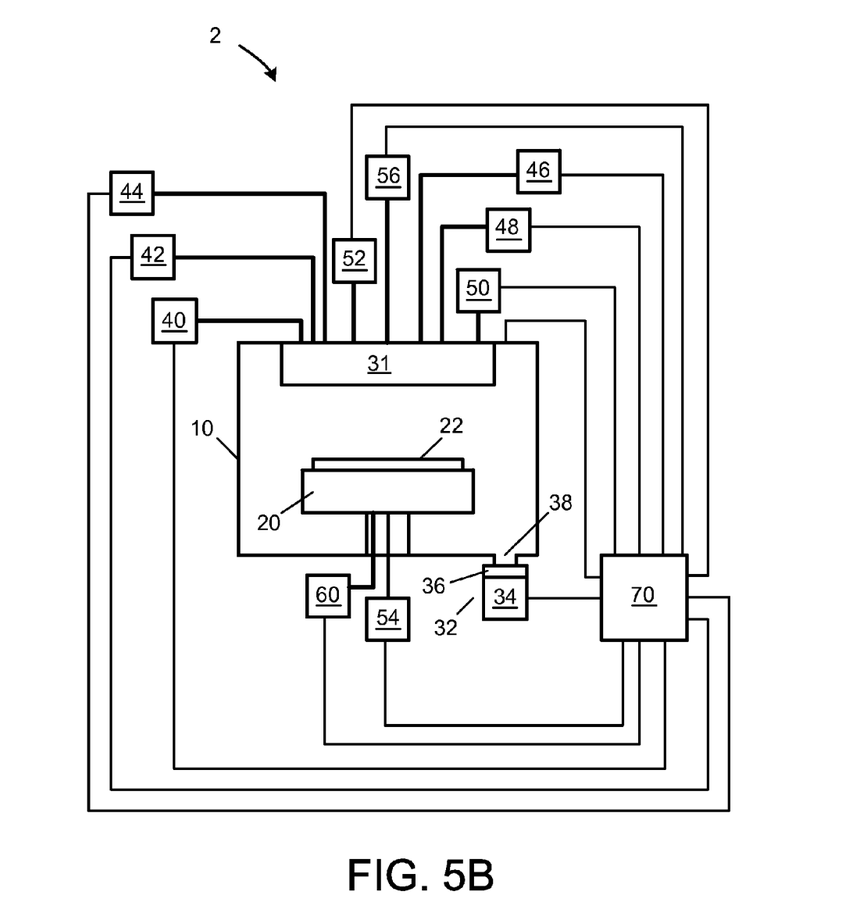
FIG. 5B illustrates a processing system for depositing a dielectric film on a substrate according to another embodiment of the invention.

FIG. 5B illustrates a plasma enhanced processing system 2 for depositing a dielectric film on a substrate according to an embodiment of the invention. The plasma enhanced processing system 2 is similar to the processing system 1 described in FIG. 5A, but further includes a plasma generation system configured to generate a plasma during at least a portion of the gas exposures in the process chamber 10. This allows formation of ozone and plasma excited oxygen from an oxygen-containing gas containing $O_2$, $H_2O$, $H_2O_2$, or a combination thereof. Similarly, plasma excited nitrogen may be formed from a nitrogen-containing gas containing $N_2$, $NH_3$, or $N_2H_4$, or $C_1$-$C_{10}$ alkylhydrazine compounds, or a combination thereof.

Also, plasma excited oxygen and nitrogen may be formed from a process gas containing NO, $NO_2$, and $N_2O$, or a combination thereof. The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716.

According to one embodiment of the invention, the plasma enhanced processing system 2 includes a substrate bias generation system configured to generate or assist in generating a plasma (through substrate holder biasing) during at least a portion of the alternating introduction of the gases to the process chamber 10. The substrate bias system can include a substrate power source 54 coupled to the process chamber 10, and configured to couple power to the substrate 25. The substrate power source 54 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 1B as separate entities, they may indeed comprise one or more power sources coupled to substrate holder 20.

In addition, the plasma enhanced processing system 2 includes a remote plasma system 56 for providing and remotely plasma exciting an oxygen-containing gas, a nitrogen-containing gas, or a combination thereof, prior to flowing the plasma excited gas into the process chamber 10 where it is exposed to the substrate 25. The remote plasma system 56 can, for example, contain a microwave frequency generator. The process chamber pressure can be between about 0.1 Torr and about 10 Torr, or between about 0.2 Torr and about 3 Torr.

A plurality of embodiments for depositing a dielectric film with low contaminant levels on a substrate have been disclosed. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned structure is directly on and in immediate contact with the substrate; there may be a second film or other structure between the film and the patterned structure.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for depositing a dielectric film on a substrate, comprising:
   providing the substrate in a process chamber;
   exposing the substrate to a gaseous precursor to form an adsorbed layer on the substrate;
   exposing the adsorbed layer to an oxygen-containing gas, a nitrogen-containing gas, or an oxygen- and nitrogen-containing gas, or a combination thereof, to form the dielectric film on the substrate;
   generating a hydrogen halide gas in the process chamber by a decomposition reaction of a hydrogen halide precursor gas; and
   exposing the dielectric film to the hydrogen halide gas to remove contaminants from the dielectric film.

2. The method of claim 1, wherein the gaseous precursor contains a silicon precursor, a germanium precursor, a metal precursor, or a combination thereof.

3. The method of claim 2, wherein one or more of the silicon precursor, the germanium precursor, or the metal precursor do not contain a halogen.

4. The method of claim 2, wherein the silicon precursor contains silane ($SiH_4$), disilane ($Si_2H_6$), an alkyl silane, an amino silane, or a combination thereof.

5. The method of claim 4, wherein the metal precursor comprises a hafnium precursor, a zirconium precursor, or a combination thereof.

6. The method of claim 5, wherein the hafnium precursor is selected from $Hf(NMe_2)_4$, $Hf(NEtMe)_4$, $Hf(NEt_2)_4$, or a hafnium cyclopentadienyl, or a combination thereof, and the zirconium precursor is selected from $Zr(NMe_2)_4$, $Zr(NEtMe)_4$, $Zr(NEt_2)_4$, or a zirconium cyclopentadienyl, or a combination thereof.

7. The method of claim 1, wherein the generating comprises flowing a halogenated hydrocarbon into the process chamber.

8. The method of claim 7, wherein the halogenated hydrocarbon includes a halogenated alkane, a halogenated alkene, or a halogenated alkyne, or a combination thereof.

9. The method of claim 7, wherein the halogenated hydrocarbon includes 1,1,1-trichloroethane or trans-1,2-dichloroethylene.

10. A method for depositing a dielectric film on a substrate, comprising:
    providing the substrate in a process chamber;
    exposing the substrate to a gaseous precursor to form an adsorbed layer on the substrate;
    exposing the adsorbed layer to a hydrogen halide gas to remove contaminants from the adsorbed layer, wherein the exposing the adsorbed layer to the hydrogen halide gas further includes generating the hydrogen halide gas in the process chamber by a decomposition reaction of a hydrogen halide precursor gas; and
    thereafter, exposing the adsorbed layer to an oxygen-containing gas, a nitrogen-containing gas, or an oxygen- and nitrogen-containing gas, or a combination thereof, to form the dielectric film on the substrate.

11. The method of claim 10, wherein the hydrogen halide precursor gas contains a halogenated hydrocarbon.

12. The method of claim 11, wherein the halogenated hydrocarbon includes a halogenated alkane, a halogenated alkene, or a halogenated alkyne, or a combination thereof.

13. The method of claim 10, wherein the gaseous precursor contains a silicon precursor, a germanium precursor, or a metal precursor, or a combination thereof.

14. The method of claim 13, wherein one or more of the silicon precursor, the germanium precursor, and the metal precursor do not contain a halogen.

15. The method of claim 13, wherein the silicon precursor contains silane ($SiH_4$), disilane ($Si_2H_6$), an alkyl silane, an amino silane, or a combination thereof.

16. The method of claim 13, wherein the metal precursor comprises a hafnium precursor, a zirconium precursor, or a combination thereof.

17. The method of claim 16, wherein the hafnium precursor is selected from $Hf(NMe_2)_4$, $Hf(NEtMe)_4$, $Hf(NEt_2)_4$, or a hafnium cyclopentadienyl, or a combination thereof, and the zirconium precursor is selected from $Zr(NMe_2)_4$, $Zr(NEtMe)_4$, $Zr(NEt_2)_4$, or a zirconium cyclopentadienyl, or a combination thereof.

18. The method of claim 17, wherein the halogenated hydrocarbon includes 1,1,1-trichloroethane or trans-1,2-dichloroethylene.

19. A method for depositing a dielectric film on a substrate, comprising:
    providing the substrate in a process chamber;
    exposing the substrate to a gaseous precursor containing silicon, germanium, a metal, or a combination thereof, to form an adsorbed layer on the substrate, wherein the adsorbed layer further contains carbon and/or nitrogen contaminants;
    exposing the substrate to an oxygen-containing gas, a nitrogen-containing gas, or an oxygen- and nitrogen-containing gas, or a combination thereof, to form the dielectric film on the substrate;
    generating a hydrogen halide gas in the process chamber by a decomposition reaction of a hydrogen halide precursor gas; and
    exposing the adsorbed layer, the dielectric film, or both the adsorbed layer and the dielectric film, to the hydrogen halide gas to remove the contaminants from the adsorbed layer, from the dielectric film, or from both the adsorbed layer and the dielectric film.

* * * * *